(12) United States Patent
Hamren et al.

(10) Patent No.: US 6,293,817 B1
(45) Date of Patent: Sep. 25, 2001

(54) EXTENDED LENGTH, HIGH FREQUENCY CONTACTOR BLOCK

(75) Inventors: Steven L. Hamren; Justin L. Lawrence, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/368,602

(22) Filed: Aug. 4, 1999

(51) Int. Cl.[7] .......................... H01R 11/18; H01R 13/00; H01R 13/66; H01R 33/945
(52) U.S. Cl. ................................. 439/482; 439/620
(58) Field of Search ........................... 439/620, 527, 439/533, 482; 324/158.1, 754, 761

(56) References Cited

U.S. PATENT DOCUMENTS

| | | | |
|---|---|---|---|
| 3,659,247 | * 4/1972 | Chaney et al. | 439/32 |
| 4,370,011 | 1/1983 | Suzuki et al. . | |
| 4,419,626 | * 12/1983 | Cedrone et al. | 324/761 |
| 4,747,784 | 5/1988 | Cedrone . | |
| 4,866,374 | 9/1989 | Cedrone . | |
| 5,127,837 | 7/1992 | Shah et al. . | |
| 5,208,529 | 5/1993 | Tsurishima et al. . | |
| 5,502,397 | 3/1996 | Buchanan . | |
| 5,645,434 | * 7/1997 | Leung | 439/74 |
| 5,734,270 | 3/1998 | Buchanan . | |
| 5,757,200 | 5/1998 | Yamashita . | |
| 5,800,205 | 9/1998 | Arakawa . | |
| 5,828,223 | 10/1998 | Rabkin et al. . | |
| 5,839,722 | * 11/1998 | Berlin et al. | 271/265.02 |
| 5,936,382 | * 8/1999 | Jones et al. | 320/132 |
| 6,091,062 | * 7/2000 | Pfahni et al. | 219/497 |

OTHER PUBLICATIONS

Unknown, "Characteristic Impedance of Cables at High and Low Frequencies," http://www.belden-wire.com/products/ciocahalf.htm. No date.

* cited by examiner

Primary Examiner—Brian Sircus
Assistant Examiner—Chandrika Prasad
(74) Attorney, Agent, or Firm—Thorp Reed & Armstrong, LLP

(57) ABSTRACT

An extended length, high frequency contactor block has a plurality of signal conductors, each having a contact element formed at its end. Each signal conductor has an inductance which is an inherent material property. The signal conductors are disposed within a plurality of layers configured to form a capacitor with each signal conductor. The plurality of layers is further configured to provide a capacitance which has a controlled relationship to the inductance of the signal conductors. The relationship may be controlled such that the impedance of each signal conductor is minimized. Because impedance is independent of length, the contactor block can be made to any length desired. A method of manufacturing a contactor block is also disclosed.

37 Claims, 4 Drawing Sheets

EXTENDED LENGTH, HIGH FREQUENCY CONTACTOR BLOCK

FIELD OF THE INVENTION

This invention relates to contactor blocks used in testing integrated-circuit (IC) chips. Specifically, this invention relates to an extended length, high frequency contactor block that will accommodate today's higher frequency ICs and allow testing within a temperature-controlled chamber while not adversely affecting the temperature of the device under testing (DUT).

BACKGROUND OF THE INVENTION

IC chips are well known in the art. IC chips may contain thousands of microscopic circuit elements such as transistors, resistors, etc. Commercially-available ICs are normally contained or packaged in a molded plastic housing having a generally rectangular or square configuration, having one or more rows of evenly-spaced pins or leads extending perpendicularly from one face of the body and disposed along opposite and parallel sides of the body or, alternatively, along each side of the body.

The IC may be a surface mounted device ("SMD") designed to be mounted directly on the surface of a circuit board, motherboard or within a suitable receiving socket. Alternatively, an IC may be a dual-in-line packaged ("DIP") device intended for mounting with leads passing through the circuit board or within a suitable socket rather than for surface mounting.

Regardless of the nature of the semiconductor device or the manner of mounting, the reliability and functionality of the IC embodied in the device are important considerations for both manufacturers and users alike. A manufacturer, for example, may wish to inspect a production run or lot of semiconductor devices and discard those found to be defective. Additionally, the manufacturer would like to obtain a true and correct assessment of the capabilities of the device such as, for example, the maximum operating speed, which are directly related to the price the manufacturer can charge for the device. A customer, on the other hand, seeks an assurance that the device purchased from the manufacturer will perform according to manufacturer's specifications under real operating conditions.

Both manual and automatic apparatuses have been developed for testing the performance of an IC. Manual testing requires the operator to manually place each device into a test circuit board, conduct the test and then remove the device from the test equipment. By contrast, an automatic testing apparatus, commonly known as a "handler," includes a mechanism for automatically moving the DUT into electrical contact with the testing apparatus. In a typical handler, the device is momentarily brought to rest at a test station where a contactor mounted on a handler interface board (HIB) or motherboard connects to the pins of the IC and establishes a signal path or link between the device and the testing apparatus. To determine whether a device is defective or functional, a series of test signals having a known response is generated by the testing apparatus and delivered by the contactor to the device. The response at some or all of the pins is then measured and compared to the expected response. If the results of the test do not match the predetermined responses, the device is considered to be defective or of an inferior performance grade, and may then be disposed of as appropriate.

Present technology contactors have been designed to be as short as possible so as to increase the bandwidth and reduce the length of the signal path. While such short length contactors work well in the electrical arena, short contactors cause problems in the temperature arena. First, when the contactor is short, the DUT cannot be positioned deep within the test chamber, and, therefore, it is subject to temperature fluctuations caused by the external environment. Second, the short length acts as a heat conduit adversely affecting the temperature of the DUT. Specifically, when being tested at a higher temperature and the DUT is connected to the contactor, the contactor acts as a heat sink and rapidly degrades the temperature of the DUT. Conversely, when the DUT is at a lower temperature, the test chamber and the ambient world are divided only by the thickness of the HIB, which may lead to condensation. It seems axiomatic that, if short contactors have deficiencies, longer contactors would be better. However, simply increasing the length of the contactor can cause other problems.

The testing of integrated circuits frequently requires that the test signal be "fast-rising," that is, a signal which is a very steep, step-like increase in potential. A typical fast-rising signal may be characterized by a voltage change of 1 volt per nanosecond. Such a signal can be represented through Fourier Series analysis as being composed of a multitude of superimposed sine waves have a very high frequency, typically on the order of 300 MHz. The fast-rising signal launched by the test circuitry and carried by the contactors to the device therefore behave in the manner of a high frequency signal. The phrase "high frequency", as used in this document, refers to such fast rising signals having step-like changes in potential.

With such high frequency components in the signal, the inherent inductance of the contactors themselves becomes a problem. Inductive reactance $X_L$ produces distortions and reflections which degrade the quality and accuracy of the test. The inductance L of the contactor is a function of the cross-sectional configuration of the conductors within the contactor and its length. Inductance increases directly with the length and inversely with the cross-sectional width. Because the inductive reactance $X_L = 2 \cdot \pi \cdot f \cdot L$, for the very high frequencies associated with a fast-rising signal, the inductive reactance associated with even the relatively short contactors in normal use becomes a significant source of distortion and limits the accuracy of measurements.

One possible solution would be to increase the width of the conductors within the contactors. However, the physical constraints of the test environment limit the available dimensions. For example, the conductors must be separated laterally from adjacent conductors which each still maintaining a unique association with one lead on the DUT.

Another possible solution is simply to test each device more slowly to wait for distortions and reflections to die out. With many modem IC's, such as large memory devices, however, the speed of operation of the device itself is so fast that if the testing operation were to extend over a sufficient period of time to allow distortions and echoes induced by the fast-rising testing signal to subside, then the speed rating of the device could not be determined. In short, the testing operation must have a speed on the order of the device function being tested. Thus, the need exists for a contactor that is sufficiently long so as to provide good performance in the temperature arena while not degrading the electrical performance.

SUMMARY OF THE INVENTION

The present invention overcomes the limitations in the prior art by providing an extended length, high frequency contactor block that can deliver a clean signal to and from the DUT while allowing the DUT to be mounted farther into the test chamber so that test temperature can be maintained. The typical length of the extended length, high frequency contactor block would be between 1 and 6 inches. The contactor can be manufactured to be any required length so long as the inductance (L) and the capacitance (C) are controlled so that the contactor's impedance is independent of its length. Inductance is a characteristic of the material used to form the contactor's signal conductors. Capacitance is created by mounting the signal conductors in a dielectric sandwiched between two strips of conductive material. Thus the combination of the conductive strips-dielectric-signal conductors acts as a coaxial cable. The signal conductors, dielectric, and conductive strips may be supported and protected by a non-conductive material.

The size of the contactor and the spacing of the signal conductors will vary depending on the characteristics of the DUT. Generally, the DUT will be an IC having a rectangular shape with pins extending from opposing sides or a square chip having pins extending from all four sides. However, the contactor can be adapted to ICs of any shape or size.

In use, the contactor will be mounted on a motherboard or HIB. The motherboard or HIB is mounted adjacent to the temperature controlled test chamber and connected to the test equipment. The unattached end of the contactor provides exposed contact elements formed on the ends of the signal conductors. These contact elements come into contact with the pins of the DUT. Because the contactor of the present invention has a low impedance which is independent of its length, the contactor length can be longer than those of the prior art. Therefore, it is possible to mount the DUT well within a temperature controlled test chamber so that the temperature of the DUT can be maintained. Those benefits and advantages, and others, will become apparent from the Detailed Description of the Preferred Embodiment hereinbelow.

BRIEF DESCRIPTION OF THE DRAWINGS

For the present invention to be easily understood and readily practiced, the present invention will be described, for purposes of illustration and not limitation, in conjunction with the following figures wherein.

DETAILED DESCRIPTION OF THE PREFERRED EMBODIMENT

Figure 1:
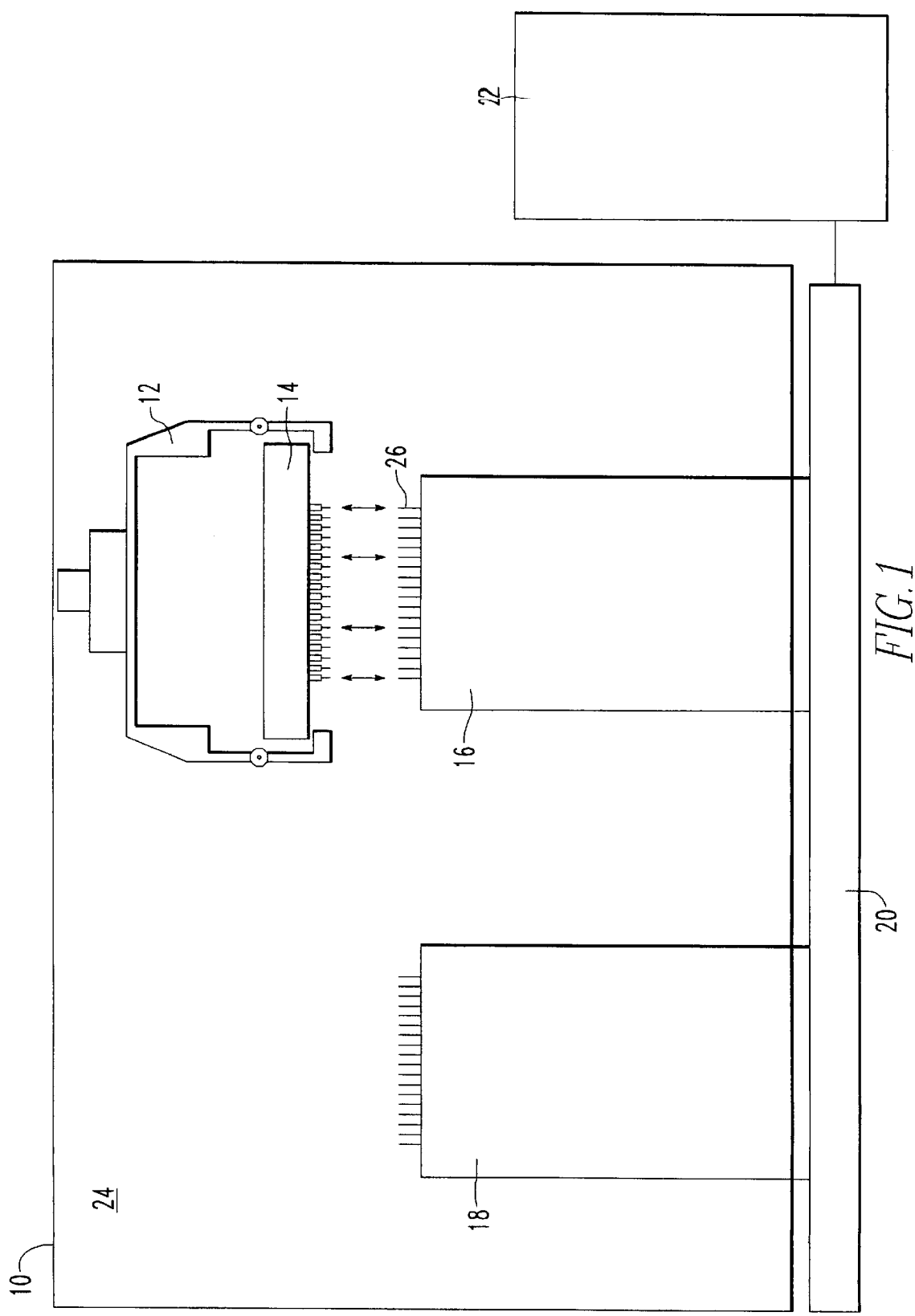
FIG. 1 is a block diagram of a system including a handler, DUT, contactor blocks constructed according to the present invention, HIB and test station.

FIG. 1 illustrates, generally, the components of an IC test system 10, including a handler 12, DUT 14, contactor blocks 16, 18, HIB 20, and test equipment 22. In practice, the ICs to be tested, located in a pre-test chamber (not shown), and the test chamber 24 will be heated or cooled to the testing temperature. The motherboard or HIB 20 is mounted adjacent to (e.g. below in FIG. 1) the test chamber 24 and is connected to the test equipment 22. First ends of the contactor blocks 16, 18 are mounted on the HIB 20. The contactor blocks 16, 18 extend from the HIB 20 into the test chamber 24 and have a second end from which a plurality of exposed contact elements 26 extend into the test chamber 24. The test system 10 may incorporate a plurality of contactor blocks mounted on the HIB 20 so that multiple ICs can be tested simultaneously. The contact elements 26 may be the exposed tips of a plurality of signal conductors 42 (seen in FIG. 2) that extend through the contactor blocks 16, 18. The signal conductors 42 also protrude from the bottom of the contactor blocks 16, 18 where they mate with a socket (not shown) on the HIB 20. Alternatively, the contactor blocks 16, 18 can be mounted directly on the HIB 20. Conductive traces 27 (seen in FIG. 2) within or on the HIB 20 contact the signal conductors 42 and allow the test signals to be communicated through the HIB 20 to the test equipment 22.

The contactor blocks 16, 18 are referred to as having an extended length because they extend a substantial distance into the chamber 24. "Substantial", as used in conjunction with the distance the contactor blocks 16, 18 extend into the chamber 24, means that the DUT is sufficiently displaced from the HIB 20 such that the contactor blocks 16, 18 will not act as a heat sink during elevated temperature testing and will not act as a heat source during low temperature testing such that the DUT can be maintained reasonably close to the desired test temperatures. In practice, that distance will be greater than one inch and, in the preferred embodiment, between one and six inches. The length of the contactor blocks 16, 18 depends upon the difference between the elevated temperatures and ambient, and the low temperatures and ambient. Generally, longer contactor blocks 16, 18 will be needed for tests involving temperatures which present larger variations from ambient temperatures. Contactor block length is also dependent on handler design, e.g. the depth of the chamber.

The IC handler 12 removes an IC from the pre-test chamber and moves into the test chamber 24 so that the IC becomes the DUT 14. IC handlers 12 are well known in the art and may use a grasping or suction means, or any other common means, to pick up the IC. In FIG. 1, the IC handler shown has a claw-like grasping mechanism. While in the test chamber 24, the handler 12 lowers the DUT 14 until the pins of the DUT make contact with the contact elements 26 of the contactor blocks 16, 18. Once the pins of the IC contact the contact elements 26, a circuit is completed and the test equipment 22 may be used to run the test. Once the test is complete, the handler 12 removes the IC from the test chamber 24 for further processing. The handler 12 then returns to the pre-test chamber to perform the procedure again with another IC.

Figure 2:
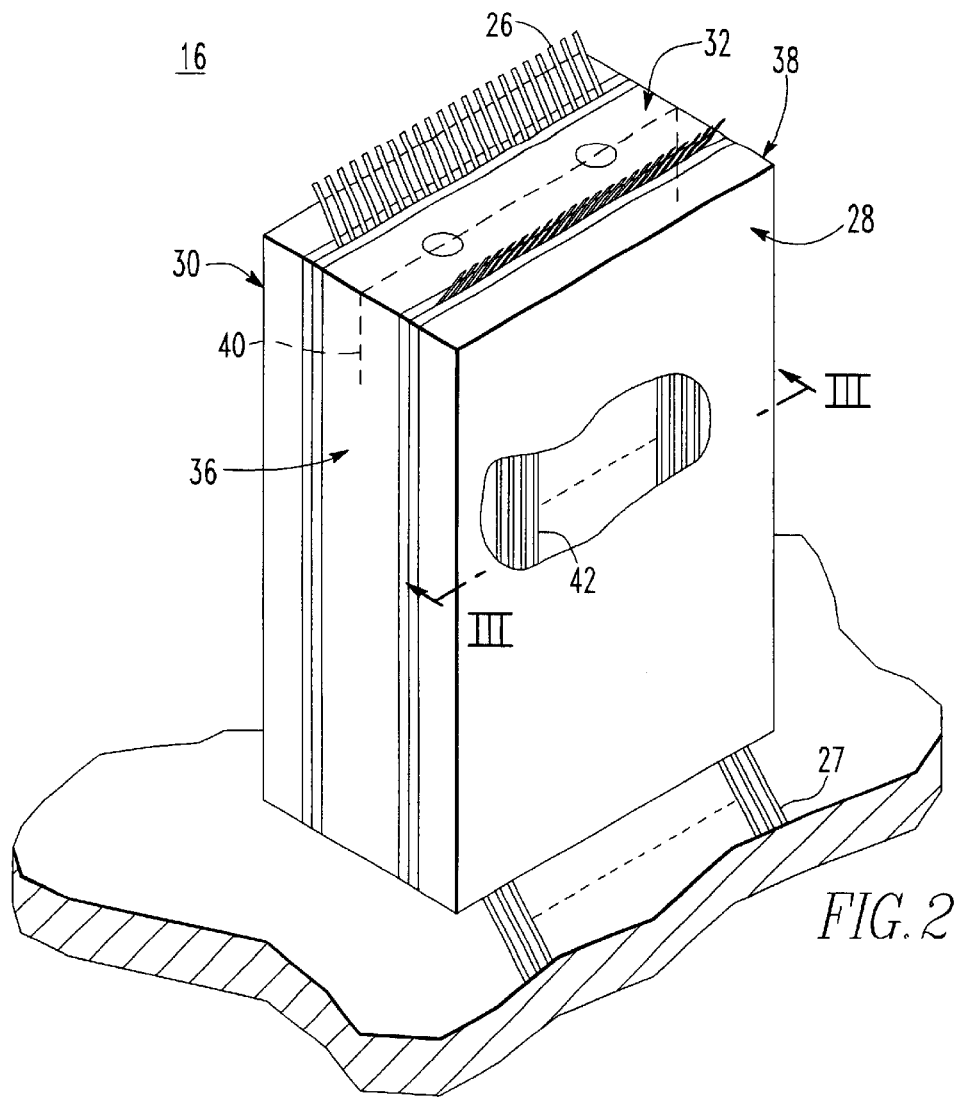
FIG. 2 is a perspective view of one of the contactor blocks of FIG. 1.
Figure 3:
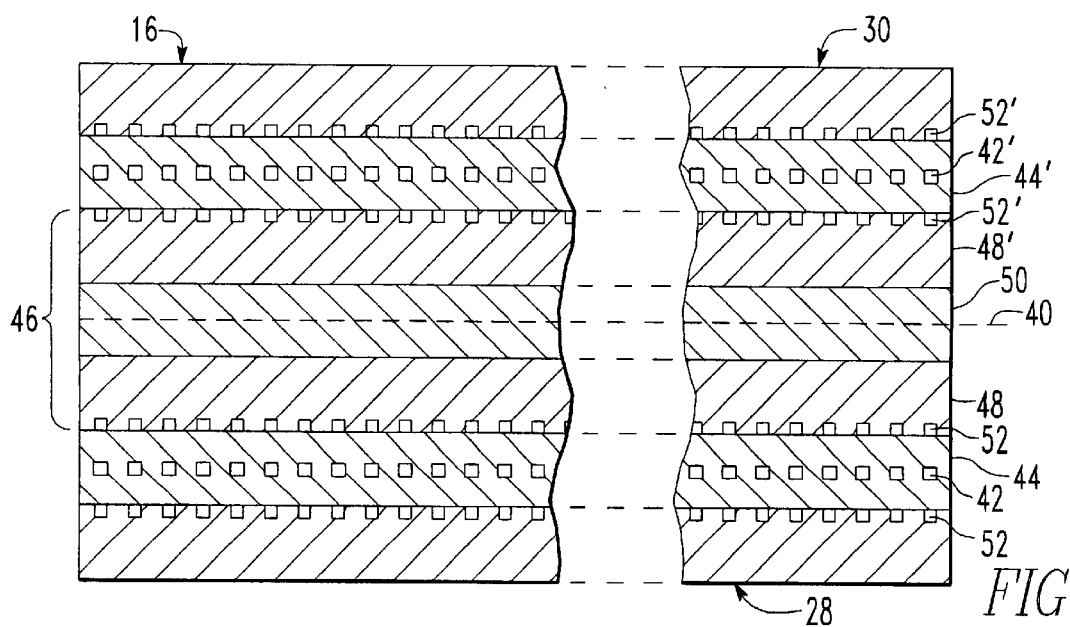
FIG. 3 is a cross-sectional view of a contactor block with two pluralities of signal conductors and is taken along the lines III—III of FIG. 2.

FIGS. 2 and 3 illustrate the extended length contactor block 16 used to test ICs in the temperature controlled chamber 24. The contactor block 16 shown has a rectangular shape typical of ICs. However, the contactor block may be shaped to fit any DUT. The contactor block 16 has a front face 28, a rear face 30, a top face 32, a bottom face (not shown), and two side faces, 36 and 38. In the preferred embodiment, the contactor block 16 is symmetrical about a plane 40 that is parallel to the front face 28 and the rear face 30. Accordingly, it is understood that although the contactor block 16 will be described in terms of the structure in front of plane 40 as seen in FIG. 2, identical structure (noted with a prime symbol next to the applicable reference number) is located in a mirror image fashion behind the plane 40.

As shown in FIG. 3, the front face 28 and the rear face 30 can be made of a non-conductive material such as, for example, Torlon® or Ultem® and have a thickness of between 0.020 inches and 0.25 inches, for example. This non-conductive material acts as a support for the contactor block as well as a protective shell for the signal conductors 42, described below. It should be noted that, although used in the preferred embodiment, the front face 28 and the rear face 30 are not required to practice this invention. This is particularly true where the dielectric material 44, described below, is comprised of a rigid fiberglass-reinforced epoxy such as FR4.

Beneath the front face 28 is a first layer of dielectric material 44, such as FR4, CE, GETEK, or any fiberglass-reinforced epoxy that can handle the testing temperatures. The first layer of dielectric material 44 extends from the top face 32 to the bottom face and between the two side faces 36 and 38. The dielectric constant and thickness of the dielectric material 44 vary depending on the desired electrical characteristics of the contactor block 16.

Disposed within the dielectric material 44 is the first plurality of signal conductors 42. As shown on FIG. 2, the upper ends of the first plurality of signal conductors 42 protrude from the top face 32 of the contactor 16 to form contact elements 26 that make contact with the pins of the DUT 14. The contact elements 26 are cantilevered so that the upper ends will gently contact the pins of the DUT 14. The signal conductors 42 may be composed of any suitable conductive material such a one-half oz. copper. The signal conductors 42 are spaced so that any signal passed through one signal conductor does not unduly interfere with the signal in another signal conductor. The signal conductors 42 are also disposed approximately in the center of the first layer of dielectric material 44.

The signal conductors 42 may be formed by etching a channel on a plate made from a dielectric material, depositing copper in the channels, etching the copper if necessary, then fixing a second plate of dielectric material to the first plate so that the channels are sandwiched between the plates. When the two plates are fixed to each other, the first layer of dielectric material 44 is formed. Alternatively, the signal conductors 42 may be formed by arranging conductive signal wires in a liquid dielectric epoxy resin followed by curing the resin. The channels may be on the order of 0.010 inches in width and have a depth on the order of 0.0007 inches.

Returning to FIG. 3, an inner layer of non-conductive support material 46 is positioned behind the first layer of dielectric material 44. The layer 46 may be a single layer or, as shown in the preferred embodiment, three separate layers, one layer 48 adjacent to dielectric layer 44, one layer 48' adjacent to dielectric layer 44', and one layer 50 separating the two layers 48, 48'. The front face 28, rear face 30, and layers 48, 48' and 50 may all be comprised of the same material.

Disposed between the front face 28 and the first dielectric layer 44 and between the layer 48 and the first dielectric layer 44 is a plurality of conductive strips 52. The conductive strips run from the top face 32 to the bottom face. Each conductive strip 52 is aligned with one of the signal conductors 42 so that each signal conductor 42 is between two conductive strips 52 located outside the dielectric layer 44. No strip of conductive material 52 contacts an adjacent strip. Depending on the hardness of the material used to form the front face 28, the rear face 30, and the layers 48, 48', and the hardness and dimensions of the conductive material used form the conductive strips 52, 52', the front face 28, rear face 30, and layers 48, 48' may have to be etched to accommodate the conductive strips 52, 52'.

Figure 7:
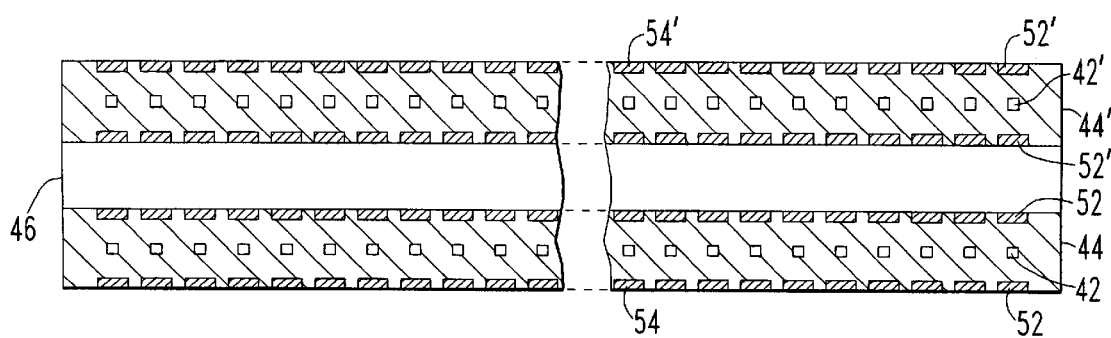
FIG. 7 is a cross-sectional view of another alternative embodiment of a contactor block constructed according to the present invention.

In an alternative embodiment shown in FIG. 7, the plurality of conductive strips 52 is located in channels 54 etched on the surfaces on the dielectric layer 44. The strips 52 may be deposited in channels 54, or a layer of conductive material may be deposited and etched to leave channels 54 filled with conductive material. Because the surfaces of dielectric layers 44, 44' are smooth, it is not necessary to provide the front face 28 and rear face 30, although it is still desirable to use such faces to protect the plurality of conductive strips 52, 52'.

Figure 4:
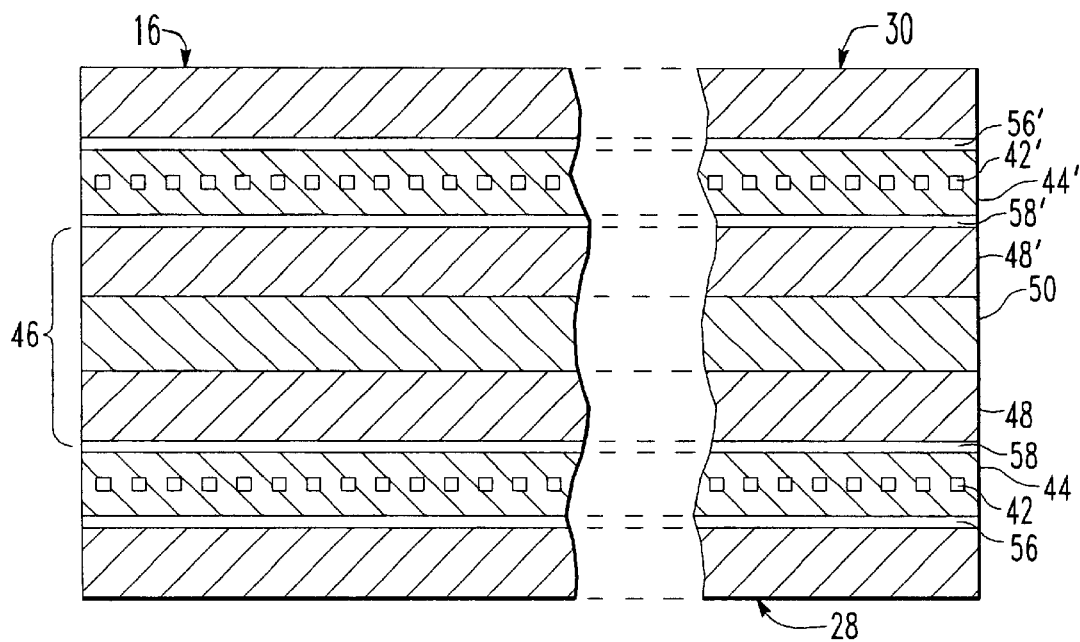
FIG. 4 is a cross-sectional view of another embodiment of a contactor block constructed according to the present invention.

Alternatively, as shown in FIG. 4, the first plurality of conductive strips 52 may be replaced with a pair of substantially parallel conductive plates 56, 58. The conductive plate 56 is referred to as an outer conductive plate and is located between front face 28 and dielectric layer 44. The conductive plate 58 is referred to as an inner conductive plate located between the conductive layer 44 and the layer 48. The conductive plates 56, 58 are positioned on the outer surfaces of the dielectric layer 44 so as to sandwich the dielectric layer 44. Use of the conductive plates 56, 58 will likely make construction of the contactor block 16 simpler.

In a preferred embodiment, the dielectric material 44 is FR4 having a dielectric constant (Dk) of 4.5. The thickness of the dielectric layer 44, as measured between the plates 56, 58 is 0.025 inches. The signal conductors 42 are made of one-half oz. copper applied as a 0.010 inch trace in the FR4 dielectric material 44. The strips of conductive material 52 are typically comprised of copper or plated copper and are typically 0.002 inches thick (thickness being measured from top to bottom in FIG. 3) and at least as wide as signal conductors 42. The length of the contactor block in the preferred embodiment is between one and six inches.

Each signal conductor 42 is encased within a dielectric material 44 and located between two conductive strips of the plurality of conductive strips 52, or between the two conductive plates 56, 58. In these configurations, the combination of "conductive material-dielectric-signal conductor-dielectric-conductive material" is substantially similar to a coaxial cable. Accordingly, the impedance of the contactor block 16 may be determined by using the equations for determining the impedance of a coaxial cable.

High frequency signals, e.g. signals changing by 1 volt per nanosecond, resemble an alternating current. For alternating current, impedance has two components: magnitude in ohms and phase. The phase of the impedance relates to the relationship between voltage and current. In a resistor, the voltage and current attain a maximum at the same time and are said to be in phase with each other. In an inductor, the voltage peaks before the current. In a capacitor, the voltage peaks after the current. For a perfect inductor, the voltage peak would occur 90° before the current peak. For a perfect capacitor, the voltage peak would occur −90° behind the current peak. In reality, inductors and capacitors always contain some resistance so the phase angle is always less than +/−90°.

Figure 5:
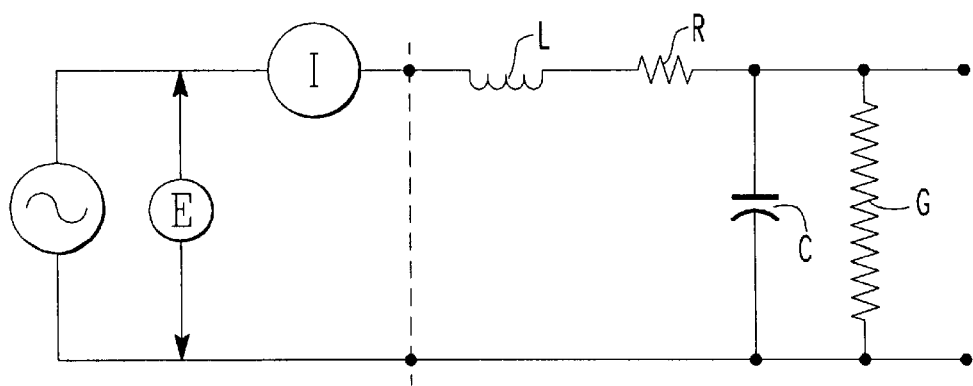
FIG. 5 is a representative circuit that approximates a coaxial cable.

In a coaxial cable, the conductors and insulation result in resistances, capacitances, and inductances that can be represented by the equivalent circuit shown in FIG. 5. These parameters are typically given per unit length. Resistance across the line, which represents the losses in the insulation, is shown as a parallel conductance (G), rather than a serial resistance (R). When an alternating voltage is applied to the cable, with the far end open, a current will flow. With voltage (E) and current (I) measured in this circuit, impedance (Z) can now be calculated (Z=E/I). As stated above, the impedance will have some magnitude and some phase angle, which can be either positive or negative.

The characteristic impedance Zo of the cable is due to the inductive reactance and the capacitive reactance and is equal to:

$$Zo = \frac{\sqrt{Rj2\pi fL}}{Gj2\pi fC}$$

Where:
f is frequency in hertz
L is inductance in henries per unit length
C is capacitance in farads per unit length
R=The series resistance of the conductor in ohms per unit length.
G=The shunt conductance in mhos per unit length
j=A symbol indicating that the term has a phase angle of +90°
π=3.1416

When f becomes sufficiently large, R and G may be neglected and the resultant equation can be reduced to:

$$Zo = \sqrt{\frac{L}{C}}$$

When L and C are independent of frequency, which is true in the high frequency region, Zo is constant, and because there are no "j" terms, the phase angle is zero. Thus, impedance remains constant and is independent of length of the coaxial cable. Additionally, by choosing the proper materials, the relationship between the capacitance and the inductance can be controlled so that the impedance is minimized as well as constant. Therefore, it is possible to construct a contactor block of sufficient length to extend from an HIB mounted adjacent to a temperature controlled test chamber to a point substantially within the test chamber. Such an extended length contactor solves the problems of the prior art because the DUT is not affected by external temperature fluctuations and can be maintained at a constant temperature while within the temperature controlled test chamber.

Figure 6:
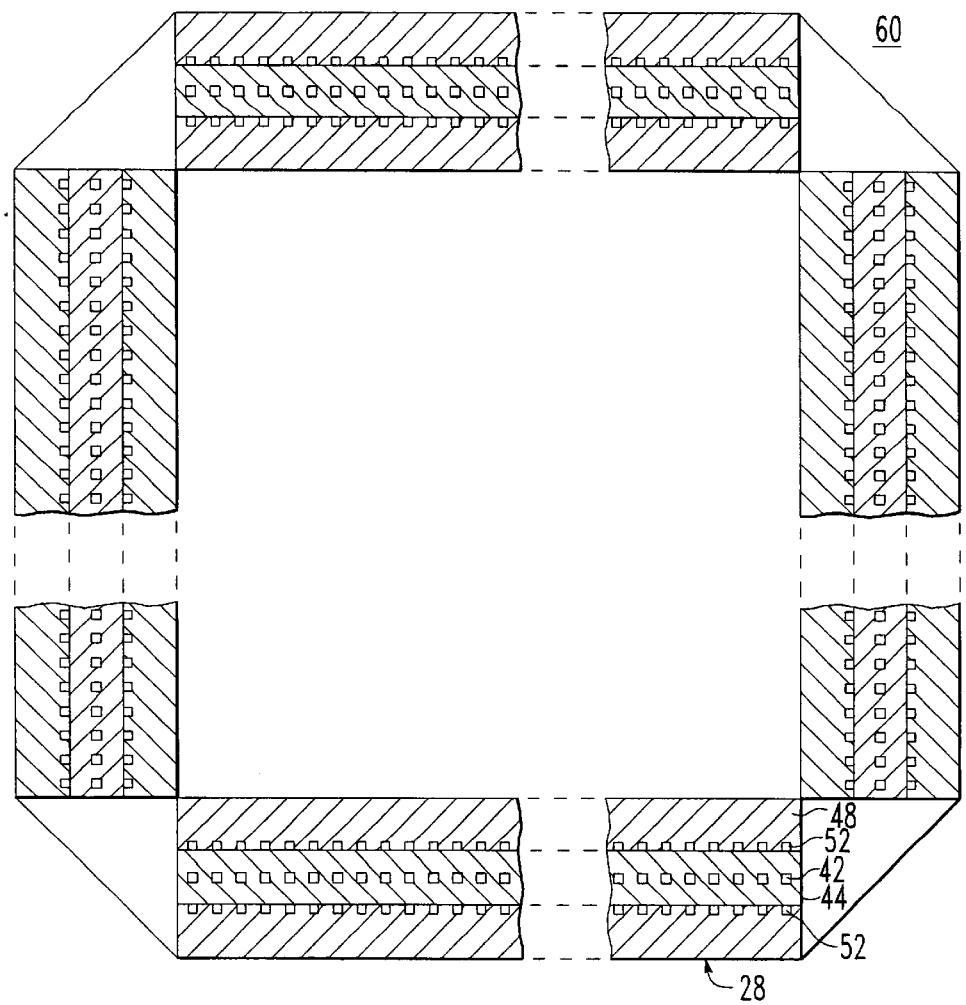
FIG. 6 is a cross-sectional view of a square contactor block constructed according to the present invention.

The configuration of the present invention shown in FIG. 3 may be used for rectangular ICs having parallel rows of pins extending therefrom. The distance between the two rows of signal conductors 42 may be varied to take into account different pin configurations, e.g. pins extending from the center of the IC, pins extending from the edges of the IC, etc. The concepts of the present invention are extendable to ICs having other shapes as well, as shown in FIG. 6. In FIG. 6, a contactor block 60 is configured so that the overall shape is a square. However, the configuration of layers remains as described above, i.e., signal conductors 42 within a dielectric layer 44, with a plurality of conductive strips 52 (alternatively conductive plates) on the outside of the dielectric layer 44, a front face 28, and a layer 48.

Another alternative embodiment is shown in FIG. 7. As noted above, the invention may be practiced without the front face 28 and rear face 30. FIG. 7 shows such an embodiment. In this configuration, the first plurality of conductive strips 52 may be protected by etching channels 54 in the dielectric layer 44 and forming the first plurality of conductive strips 52 in the channels 54. As also shown in FIG. 7, the conductors of the first plurality of conductive strips 52 may be wider, in the direction between the side faces 36, 38, than the signal conductors 42.

While the present invention has been described in connection with a preferred embodiment thereof, those of ordinary skill in the art will recognize that many modifications and variations thereof are possible. For example, although the signal conductors 42 are shown as having a square cross section in FIGS. 3, 4, 6, and 7, the signal conductors may be of other cross sections such as rectangular. Another example of a modification of the present invention is to provide different types of contact elements 26. The foregoing disclosure and the following claims are intended to encompass all such modifications and variations.

We claim:

1. An extended length, high frequency contactor block, comprising:
a plurality of signal conductors having contact elements formed on ends thereof, each signal conductor having an inductance associated therewith;
a plurality of layers configured to form a capacitor with each signal conductor, wherein each signal conductor acts as one of the plates of the capacitor and wherein said plurality of layers is further configured to provide a capacitance having a relationship to said inductance such that an impedance of the contactor is constant and independent of length; and
an outer shell of rigid non-conductive material applied to said plurality of layers to form a first face and a second face.

2. An extended length, high frequency contactor block as in claim 1 further comprising:
a second plurality of signal conductors disposed within said outer shell and having flexible contact elements formed on ends thereof, each signal conductor having an inductance associated therewith; and
a second plurality of layers disposed within said outer shell and configured to form a capacitor with each signal conductor of said second plurality of signal conductors, wherein each signal conductor acts as one of the plates of the capacitor and wherein said second plurality of layers is further configured to provide a capacitance having a relationship to said inductance such that an impedance of the contactor is constant and independent of length.

3. An extended length, high frequency contactor block as in claim 1 wherein said contactor block is between one and six inches in length.

4. An extended length, high frequency contactor block as in claim 1 wherein the number of signal conductors is at least equal to the number of pins of a semiconductor device to be tested.

5. An extended length, high frequency contactor block as in claim 1 wherein said signal conductors are approximately 0.010 inches in width and 0.0007 inches thick.

6. A high frequency contactor block, comprising:
a layer of rigid dielectric material having two outer surfaces;
a plurality of signal conductors extending through said dielectric material, said conductors having flexible contact elements formed on ends thereof extending beyond said dielectric material; and a plurality of conductive strips positioned along said outer surfaces of said layer of dielectric material such that two of each of said plurality of conductive strips are aligned with one of said plurality of signal conductors so that there is one conductive strip on either side thereof and an impedance of each signal conductor is independent of its length.

7. A high frequency contactor block as in claim 6 wherein said impedance of each signal conductor is minimized.

8. A high frequency contactor block as in claim 6 wherein said dielectric layer has a plurality of channels on said outer surfaces and said conductive strips are positioned within said channels.

9. A high frequency contactor block as in claim 6 further comprising an outer shell of non-conductive material applied to said dielectric layer to form a first face and a second face.

10. A high frequency contactor block as in claim 9 further comprising a second layer of rigid dielectric material disposed within said outer shell, said second layer having two surfaces;

a second plurality of signal conductors extending through said second layer of dielectric material, said conductors having flexible contact elements formed on ends thereof and extending beyond said second layer of dielectric material; and a second plurality of conductive strips positioned along said surfaces of said second layer of dielectric material such that two of each of said second plurality of conductive strips are aligned with one of said second plurality of signal conductors so that there is one conductive strip on either side thereof and an impedance of each signal conductor is independent of its length.

11. A high frequency contactor block as in claim 6 wherein said device is between one and six inches in length.

12. A high frequency contactor block as in claim 6 wherein the number of signal conductors is at least equal to the number of pins of a semiconductor device to be tested.

13. A high frequency contactor block as in claim 6 wherein the width of the conductive strips is approximately equal to the width of said signal conductors.

14. A rigid device, comprising:

a plurality of signal conductors having flexible contact elements formed on ends thereof, each signal conductor having an inductance associated therewith;

a layer of dielectric material substantially surrounding said plurality of conductors;

a plurality of conductive layers configured such that a capacitance is provided by said plurality of signal conductors, layer of dielectric material, and plurality of conductive layers whereby an impedance of each of said signal conductors is independent of its length; and an outer shell of non-conductive material applied to said plurality of conductive layers to form a first face and a second face.

15. A rigid device as in claim 14 further comprising a second plurality of signal conductors disposed within said outer shell, said second plurality of signal conductors having flexible contact elements formed on ends thereof, each signal conductor having an inductance associated therewith;

a second layer of dielectric material disposed within said outer shell and substantially surrounding said second plurality of conductors; and a second plurality of conductive layers disposed within said outer shell and configured such that a capacitance is provided by said second plurality of signal conductors, second layer of dielectric material, and second plurality of conductive layers whereby an impedance of said second plurality of signal conductors is independent of its length.

16. A rigid device as in claim 14 wherein said device is between one and six inches in length.

17. A rigid as in claim 14 wherein the number of signal conductors is at least equal to the number of pins of a semiconductor device to be tested.

18. A rigid device as in claim 14 wherein said signal conductors are approximately 0.010 inches in width and 0.0007 inches thick, said conductive layers selected from the group consisting of copper, aluminum and brass.

19. A device, comprising:

a pair of substantially parallel conductive plates;

a layer of rigid dielectric material positioned between said plates;

a plurality of signal conductors each having an inductance associated therewith, said signal conductors extending through said dielectric material and being substantially parallel to said plates such that a capacitance is formed which has a relationship to said inductance so that an impedance of each signal conductor is constant and independent of length;

flexible contact elements formed on at least one end of said signal conductors; and an outer shell of non-conductive material applied to said pair of plates to form a first face and a second face.

20. A device as in claim 19 further comprising:

a second a pair of substantially parallel conductive plates disposed within said outer shell;

a second layer of dielectric material positioned between said plates;

a second plurality of signal conductors each having an inductance associated therewith, said signal conductors extending through said dielectric material and being substantially parallel to said second pair of plates such that a capacitance is formed which has a relationship to said inductance such that an impedance of each signal conductor of said second plurality of signal conductors is constant and independent of length; and flexible contact elements formed on at least one end of said second plurality of signal conductors.

21. A device as in claim 19 wherein said device is between one and six inches in length.

22. A device as in claim 19 wherein the number of signal conductors is at least equal to the number of pins of a semiconductor device to be tested.

23. A device as in claim 19 wherein said signal conductors are approximately 0.010 inches in width and 0.0007 inches thick, said conductive plates selected from the group consisting of copper, aluminum and brass.

24. An extended length, high frequency contactor block comprising:

a rectangular block having a front face, a rear face, a top face, a bottom face and two side faces, said front face and said rear face comprised of a rigid non-conductive support material;

a first layer of dielectric material disposed beneath said front face;

a second layer of dielectric material disposed beneath said rear face;

an inner layer of non-conductive support material disposed between said first layer of dielectric material and said second layer of dielectric material;

a first plurality of signal conductors disposed within said first layer of dielectric material, said signal conductors having an inductance associated therewith, said signal conductors running between said top face and said bottom face and having flexible contact elements formed on the ends thereof;

a second plurality of signal conductors disposed within said second layer of dielectric material, said signal conductors having an inductance associated therewith, said signal conductors running between said top face and said bottom face and having flexible contact elements formed on the ends thereof;

a first plurality of conductive strips disposed between said front face and said first layer of dielectric material and between said first layer of dielectric material and said inner layer of non-conductive support material and positioned so that two of said conductive strips are aligned with each one of said first plurality of flexible contact elements; and a second plurality of conductive strips disposed between said rear face and said second layer of dielectric material and between said second layer of dielectric material and said inner layer of non-conductive support material and positioned so that two of said conductive strips are aligned with one of each said second plurality of flexible contact elements;

wherein said configuration of signal conductors, dielectric material and conductive strips provides a capacitance having a relationship to said inductance so that the impedance of the contactor is constant and independent of length.

25. An extended length, high frequency contactor block as in claim 24 wherein said impedance of the contactor block is minimized.

26. An extended length, high frequency contactor block as in claim 24 wherein said contactor block is between one and six inches in length.

27. An extended length, high frequency contactor block as in claim 24 wherein the number of signal conductors is at least equal to the number of pins of a semiconductor device to be tested.

28. An extended length, high frequency contactor block as in claim 24 wherein the width of the conductive strips is approximately equal to the width of said signal conductors.

29. A combination, comprising:

test equipment;

a temperature controlled test chamber;

an interface board located adjacent to said test chamber and connected to said test equipment;

a high frequency contactor block having a first end connected to said interface board and a second end extending substantially into said temperature controlled test chamber;

a handler adapted to bring integrated circuit chips into and out of contact with said second end of said contactor block;

wherein said contactor block comprises:

a plurality of signal conductors having flexible contact elements formed on said second end of said contactor block, each signal conductor having an inductance associated therewith;

a plurality of layers configured to form a capacitor with each signal conductor, wherein each signal conductor acts as one of the plates of the capacitor and wherein said plurality of layers is further configured to provide a capacitance having a relationship to said inductance such that the impedance of the contactor is constant and independent of length, and an outer shell of non-conductive material applied to said plurality of layers to form a first and a second face;

said contactor block being of a substantial length such that said contactor block will not affect the temperature in said temperature controlled chamber.

30. A rigid device comprising:

a plurality of signal conductors having flexible contact elements formed on the ends thereof, each signal conductor having an inductance associated therewith;

a layer of dielectric material substantially surrounding said plurality of conductors and having two outer surfaces;

a plurality of conductive strips positioned along said outer surfaces of said layer of dielectric material such that two of each of said plurality of conductive strips are aligned with one of said plurality of signal conductors so that there is one conductive strip on either side thereof and an impedance of each signal conductor is independent of its length.

31. A device as in claim 30, wherein said impedance of each signal conductor is minimized.

32. A device as in claim 30, wherein said dielectric layer has a plurality of channels on said outer surfaces and said conductive strips are positioned within said channels.

33. A device as in claim 30 further comprising an outer shell of non-conductive material applied to said dielectric layer to form a first face and a second face.

34. A device in claim 33 further comprising a second layer of rigid dielectric material disposed within said outer shell, said second layer having two surfaces;

a second plurality of signal conductors extending through said second layer of dielectric material, said conductors having flexible contact elements formed on the ends thereof and extending beyond said second layer of dielectric material; and a plurality of conductive strips positioned along said surfaces of said layer of dielectric material such that two of each of said plurality of conductive strips are aligned with one of said plurality of signal conductors so that there is one conductive strip on either side thereof and an impedance of each signal conductor is independent of its length.

35. A device as in claim 30, wherein said device is between one and six inches in length.

36. A device as in claim 30, wherein the number of signal conductors is at least equal to the number of pins of a semiconductor device to be tested.

37. A device as in claim 30, wherein the width of the conductive strips is approximately equal to the width of said signal conductors.

* * * * *

UNITED STATES PATENT AND TRADEMARK OFFICE
CERTIFICATE OF CORRECTION

PATENT NO. : 6,293,817 B1  
DATED : September 25, 2001  
INVENTOR(S) : Hamren et al.

Page 1 of 1

It is certified that error appears in the above-identified patent and that said Letters Patent is hereby corrected as shown below:

<u>Column 10, claim 17,</u>  
Line 8, delete "rigid as" and insert -- "rigid device as" --

Signed and Sealed this

Ninth Day of April, 2002

Attest:

JAMES E. ROGAN  
*Attesting Officer*   *Director of the United States Patent and Trademark Office*